United States Patent [19]

Naito et al.

[11] Patent Number: 4,994,411
[45] Date of Patent: Feb. 19, 1991

[54] PROCESS OF PRODUCING SEMICONDUCTOR DEVICE

[75] Inventors: Takahiro Naito, Kodaira; Gen Murakami, Machida; Hiromichi Suzuki, Tokorozawa; Hajime Sato, Kodaira; Wahei Kitamura, Kodaira; Masachika Masuda, Kodaira, all of Japan

[73] Assignee: Hitachi, Ltd., Tokyo, Japan

[21] Appl. No.: 321,385

[22] Filed: Mar. 10, 1989

[30] Foreign Application Priority Data

Mar. 10, 1988 [JP] Japan ............................ 63-57902
Mar. 11, 1988 [JP] Japan ............................ 63-57520

[51] Int. Cl.⁵ .................................... H01L 21/02
[52] U.S. Cl. ............................ 437/209; 437/217; 437/219
[58] Field of Search ............... 437/209, 214, 215, 216, 437/217, 219

[56] References Cited

FOREIGN PATENT DOCUMENTS

| | | | |
|---|---|---|---|
| 3814469 | 11/1988 | Fed. Rep. of Germany | 437/209 |
| 57-133643 | 8/1982 | Japan | 437/209 |
| 59-98547 | 6/1984 | Japan | 437/209 |
| 61-236130 | 10/1986 | Japan | 437/219 |

Primary Examiner—Olik Chaudhuri
Assistant Examiner—Andrew Griffis
Attorney, Agent, or Firm—Antonelli, Terry, Stout & Kraus

[57] ABSTRACT

A process of producing a semiconductor device involving the steps of providing a lead frame having inner leads spaced from each other and connected together by a connecting portion; bonding a layer of an insulating material to the connecting portion and to surrounding portions of the inner leads; removing the connecting portion and a portion of the layer of insulating material to form end portions of the inner leads which are separated from each other and retained in a spaced arrangement by a remaning portion of the layer of insulating material; joining a semiconductor chip having bonding pads to the end portions of the inner leads; connecting the bonding pads on the semiconductor chip and the inner leads by wires; and encapsulating the semiconductor chip, the remaining portion of the layer of insulating material, the inner leads and the wires within a resin material; a peripheral portion of one face of the semiconductor chip partially overlapping faces of the end portions.

15 Claims, 10 Drawing Sheets

PROCESS OF PRODUCING SEMICONDUCTOR DEVICE

This invention relates to a process for producing a semiconductor device and further to a process for the production of a semiconductor device wherein a lead frame is joined to a semiconductor chip and the resulting assembly is encapsulated in a resin.

Conventionally, while leads of a lead frame are supported on a lead outer frame by way of tie bars, where the distance from such tie bars to ends of inner leads is great, the inner leads are readily bent at various production steps, and short-circuiting between the inner leads readily occurs. Thus, a production technique, as hereinafter described, has conventionally been used in order to prevent bending of the inner leads.

This production technique will be described with reference to FIGS. 7 and 8(A) to 8(C) of the accompanying drawings.

Figure 7:
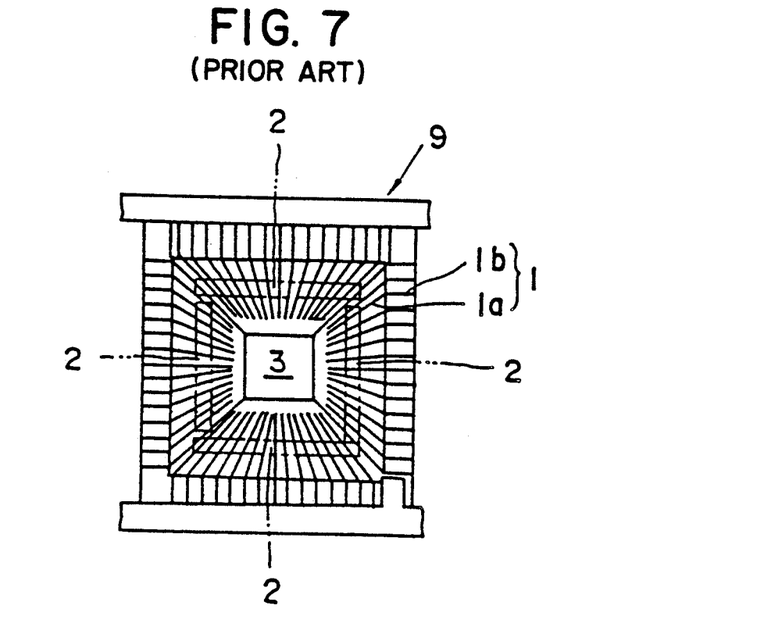
FIG. 7 is a plan view showing part of a lead frame which has been conventionally used.
Figure 8A:
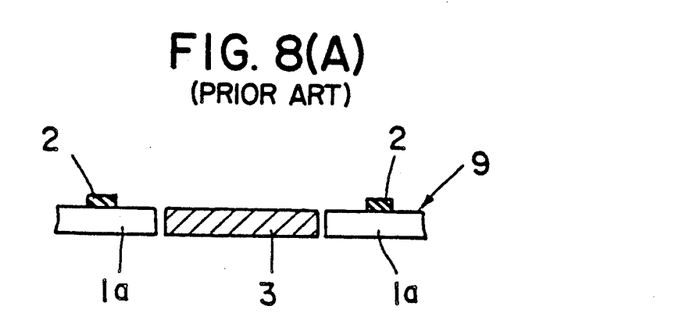
FIGS. 8(A) to 8(C) are flow diagrams illustrating a conventional process of producing a semiconductor device.

Initially, an ordinary lead frame 9 is prepared which is formed with patterning by etching or press work to have leads including inner leads 1a and outer leads 1b and insulating tapes 2 made of a polyimide resin are bonded or stuck to upper faces of the inner leads 1a of the lead frame 9 (note FIGS. 7 and 8(A)).

Figure 8B:
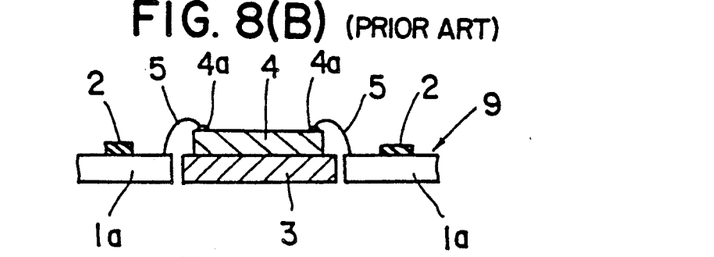
Figure 8C:
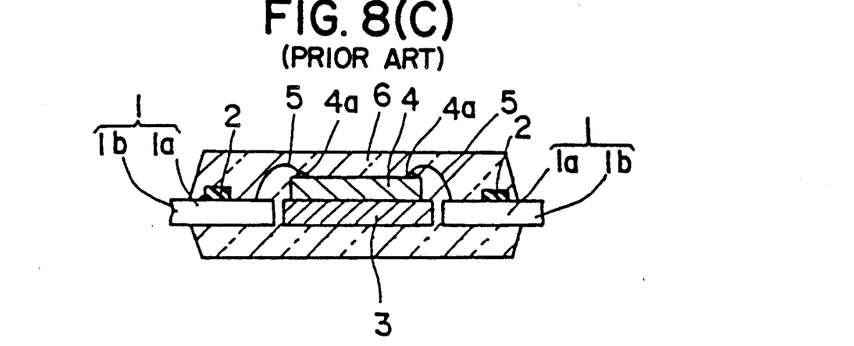

Subsequently, using a bonding agent (not shown) such as silver paste, a semiconductor chip 4 is fixed to a tab 3 of the taped lead frame as shown in FIG. 8(B), and bonding pads 4a of the semiconductor chip 4 and the inner leads 1a are electrically connected to each other by way of wires 5 of Au, Al, Cu or the like. Then, the semiconductor chip 4 and locations around the semiconductor chip 4 are coated with encapsulating resin 6 as shown in FIG. 8(C). Thereafter, solder plating is applied to outer leads 1b of the lead frame, and the leads of the lead frame 9 are separated from the lead frame outer frame while the outer leads 1b are shaped. By the steps, a resin encapsulated semiconductor device is obtained.

According to this known production technique, heat processing must be applied when the insulating tapes 2 are bonded to the inner leads; consequently, the distances between the inner leads 1a will be varied disorderly after taping due to a difference between the coefficient of thermal expansion of the insulating tapes 2 and the coefficient of thermal expansion of the inner leads 1a. By such a change in distance between the inner leads 1a, deterioration of the throughput of a production line often results.

In short, at a wire bonding step which is performed after the taping, the bonding pads 4a of the semiconductor chip 4 and the inner leads 1a are recognized and the actual wire bonding is performed depending upon the results of such recognition, but where the distances between the inner leads 1a are varied in such a manner as described above, much time is required for recognition of the inner leads 1a because the inner leads 1a must necessarily be recognized on an individual basis.

Further, with a taped lead frame which is used in the production technique described above, the insulating tapes 2 cannot be bonded or stuck to or closely adjacent to the end portions of the inner leads 1a. This is because the end portions of the inner leads 1a provide connection locations for the wires 5. Thus, the insulating tapes 2 are conventionally stuck to locations spaced from the end portions of the inner leads 1a, but in this instance, the distance from the ends of the inner leads 1a to the locations at which the insulating tapes 2 are stuck is inevitably great. Accordingly, contacts between the end portions of the inner leads 1a may be caused by a little change in distance between the inner leads at the locations at which the insulating tapes 2 are stuck, and contact between the inner leads 1a take place. As a result, there is problem that the yield on a production line of semiconductor devices is deteriorated.

Exemplary of such known techniques are the processes described in the following Japanese Patent Publications: Nos. JP-(A)-105970/1978; JP-(A)-92556/1984; JP-(A)-171733/1985; and JP-(A)-191656/1984.

Further, in recently developed semiconductor devices, there have appeared some semiconductor devices wherein a semiconductor chip 4 of a large size is encapsulated in a package of a small size. In such semiconductor devices, however, since the length of the inner leads 1a is small, a space in which the insulating tapes 2 are to be bonded cannot be assured within a resin package, and the production technique described above cannot be applied as it is.

The present invention has been made with consideration of such circumstances as described above, and it is an object of the present invention to provide a process of producing a semiconductor device in which improvements in the throughput and in the yield of a production line can be achieved.

The above and other objects and novel features of the present invention will become apparent from the following detailed description in the specification and the accompanying drawings wherein:

An outline of representative embodiments of the present invention will be hereinafter described.

In particular, after a layer of insulating material, e.g., an insulating tape, is bonded to the upper or lower faces of portions of inner leads of a lead frame which are integrally connected to a connecting portion of the lead frame, the taped portions of the inner leads are separated from the connection portion by removing the connecting portion and a part of the tape, then a semiconductor chip is arranged to partially cover faces of the resulting end portions of the inner leads and, thereafter, bonding pads of the semiconductor chip and the end portions of inner leads are connected to each other by means of wires.

With this technique, since the end portions of the inner leads are formed after the insulating tape has been applied to the portions of the inner leads mutually connected to the connecting portion and after the connecting portion has been removed, a change in distance between the inner leads is restrained by the remaining part of the insulating tape and the distances between the inner leads are maintained appropriately during the process of production. Due to this action, the time for recognition of the inner leads during wire bonding is reduced significantly and short-circuiting between adjacent wires and inner leads is prevented. As a result, the object described above provides improvements in the throughput and the yield of a production line can be attained.

Further, since in one embodiment the main face of the semiconductor chip is partially overlapped on the end portions of the inner leads and the bonding pads of the semiconductor chip and the inner leads are connected to each other at the overlapping location by means of the wires, a resin package encapsulating this semiconductor device can be reduced in size.

Further, since the semiconductor chip is joined to the end portions of the inner leads with varying degrees of overlapping, wires can be connected to arbitrary locations of the inner leads. Due to this action, it is possible to mount semiconductor chips of various sizes on a same frame, and the general applicability of the lead frame itself is improved.

In the following detailed description, embodiments of process of producing a semiconductor device according to the present invention will be described with reference to the accompanying drawings.

Figure 1:
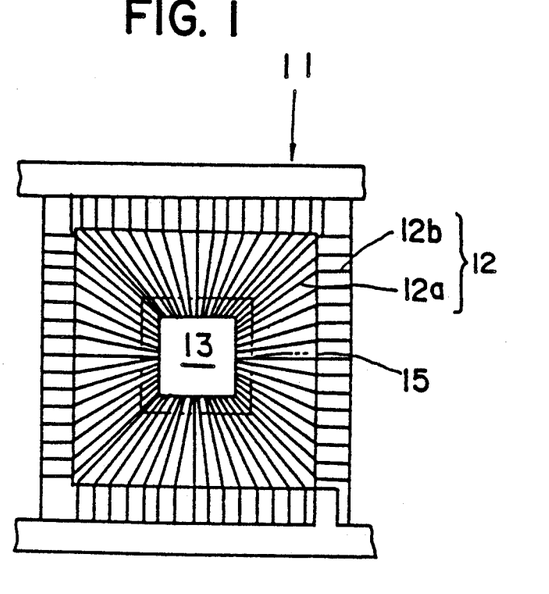
FIG. 1 is a plan view showing part of a lead frame which is used in a first embodiment of process of producing a semiconductor device according to the present invention.

In FIG. 1, there is shown a lead frame which is used in a first embodiment of process of producing a semiconductor device according to the present invention.

In this figure, reference numeral 11 denotes a lead frame formed from 42 alloy (a known iron and 42% nickel alloy), copper alloy or the like metallic material, and in the lead frame 11, the inner leads 12a of leads 12 are connected to a rectangular connecting portion 13 which is located at a central portion of the lead frame 11. In short, while the lead frame 11 is shaped by etching, press work or the like, the portions of the inner leads 12a near the central portion are spaced from each other and connected to the connecting portion 13. It is to be noted that the connecting portion 13 is constructed such that the size thereof may be a little smaller than the size of a semiconductor chip 14 to be mounted on the connecting lead frame.

Figure 2:
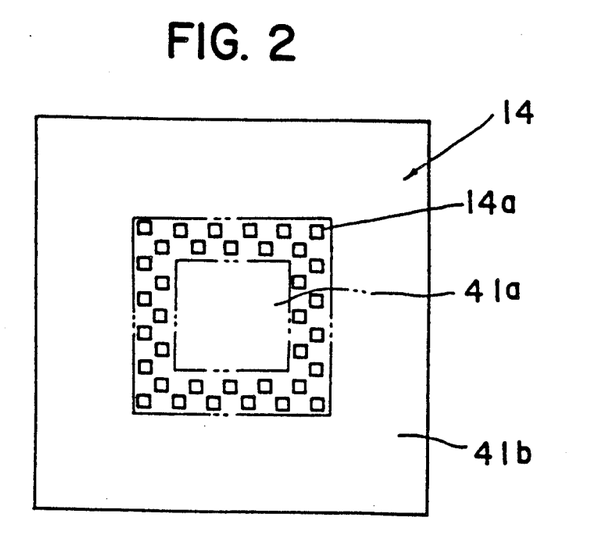
FIG. 2 is a plan view of a semiconductor chip which is used in a process of producing a semiconductor device according to the present invention.

The semiconductor chip 14 adapted to be fixed to the lead frame 11 shown in FIG. 1 is shown in FIG. 2.

The semiconductor chip 14 has a bonding pad 14a formed at a central region of a main face thereof. In order to realize such a construction, the layout within the semiconductor chip 14 may be such that, in the case of a semiconductor device such as, for example, an IC memory, through not particularly limited thereto, peripheral circuits such as a sense amplifier and a decoder are located at a central portion 41a of the semiconductor chip 14; whereas, a memory array and so on are located at the peripheral portion 41b of the semiconductor chip 14. Meanwhile, in the case of, for example, a single chip microcomputer, through not particularly limited thereto, a CPU core may be located at the central portion 41a of the semiconductor chip 14 while a ROM, a RAM, an I/O interface and so on are located at the peripheral portion 41b of the semiconductor chip 14.

Further, where the semiconductor chip 14 has a large number of bonding pads 14a, the bonding pads 14a may be disposed in a zigzag pattern as shown in FIG. 2.

Hereinafter, a process of producing a semiconductor device according to the first embodiment using the lead frame 11 will be described.

Figure 3A:
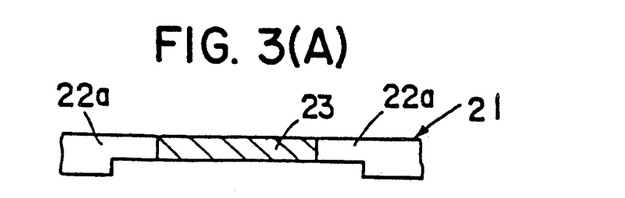
FIGS. 3(A) to 3(F) are flow diagrams of the first embodiment of process of producing a semiconductor device according to the present invention.
Figure 3B:
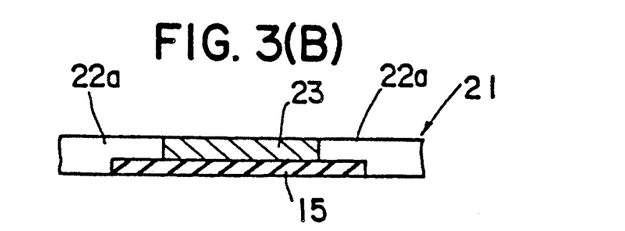

In the present embodiment, an insulating tape 15 having a size equal to or a little greater than the size of a semiconductor chip 14 (FIG. 3(B)) to be mounted on the lead frame is stuck or bonded to a lower face of a connecting portion 13 of a lead frame 11 shown in FIG. 3(A) (the lead frame being shown in FIG. 1) and to lower faces of the inner leads extending immediately adjacent to and around the connecting portion 13 (FIG. 3(B)). As the insulating tape 15, a tape is used which is made of a resin of a polyimide, though not particularly limited to this resin, and has a bonding agent applied to an upper face thereof, and bonding of the tape of the polyimide resin is made, for example, by pressurization for 0.3 seconds under 10 to 20 kg/cm² in an atmosphere of 160° to 200° C.

Figure 3C:
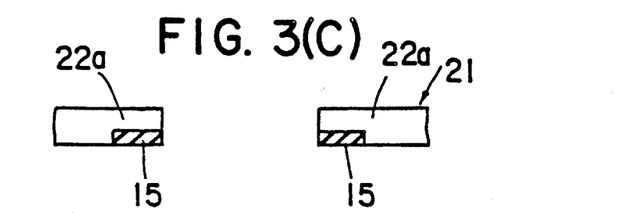
Figure 3D:
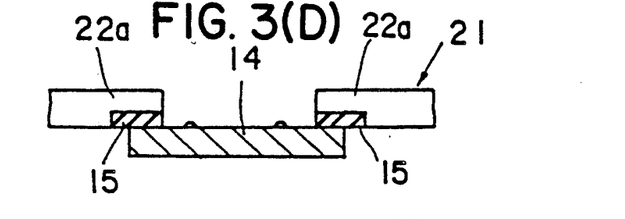
Figure 3E:
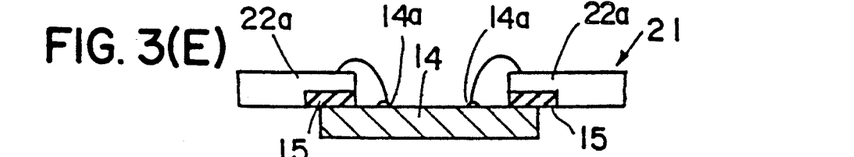
Figure 3F:
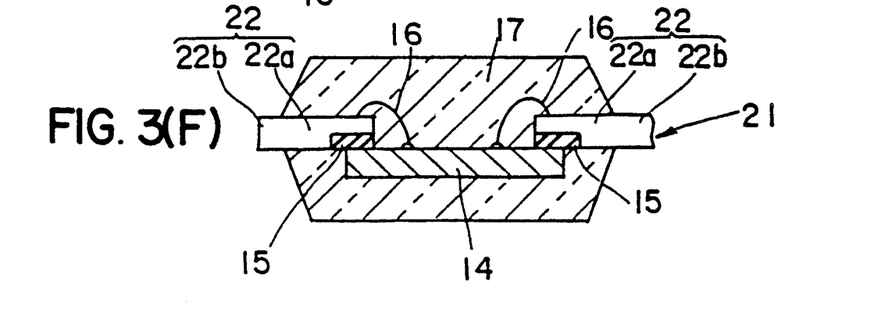

After the insulating tape 15 has been bonded in this manner, the connecting portion 13 of the lead frame 11 is punched as shown in FIG. 3(C) using a press machine to form separate end portions of the inner leads 12a (FIG. 3(D)). Also, part of the insulating tape 15 bonded to the lower face of the connecting portion 13 is punched at the same time, but the other part of the insulating tape 15 other than the punched portion remains, and the distances between the inner leads 12a are maintained appropriately by the remaining part of the insulating tape 15 as shown in FIG. 1. This remaining part of the tape is bonded to the end of each inner lead so that the end portions of the inner leads are held together.

Subsequently, at a die bonding step, the lead frame 11 is placed on a semiconductor chip 14, and the main face of the semiconductor chip 14 is joined to the lower face of the lead frame 11 via the remaining portion of tape 15 by means of a bonding agent (not shown) such as silver paste, epoxy resin or the like (FIG. 3(D)). As a method for effecting the same result, the semiconductor chip 14, in a turned over condition, may be joined to the lead frame 11 in a similarly turned over condition.

Figure 4A:
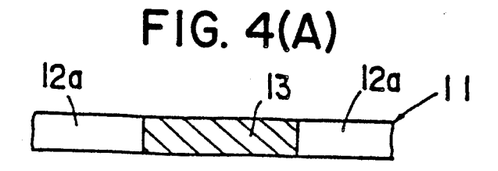
FIGS. 4(A) to 4(F) are flow diagrams of a second embodiment of process of producing a semiconductor device according to the present invention.
Figure 4B:
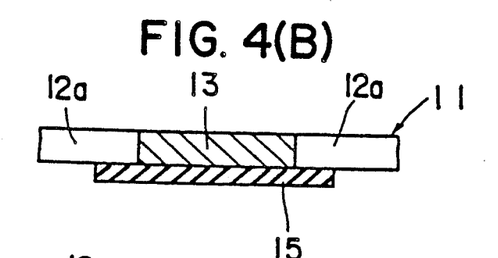
Figure 4C:
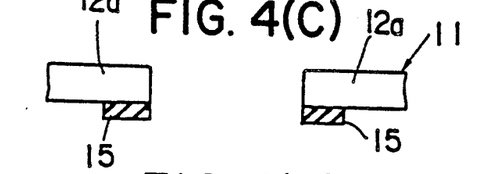
Figure 4D:
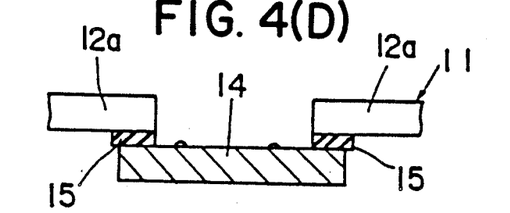
Figure 4E:
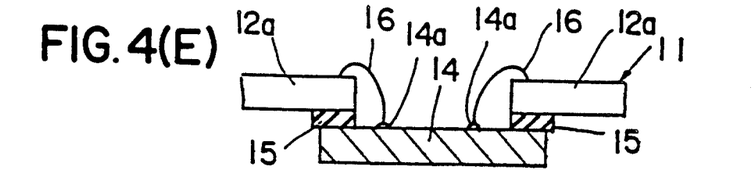

Thereafter, at a wire bonding step, bonding pads 14a of the semiconductor chip 14 and the inner leads 12a are electrically connected to each other by means of wires 16 of Au, Al, Cu or the like (FIG. 4(E)).

Figure 4F:
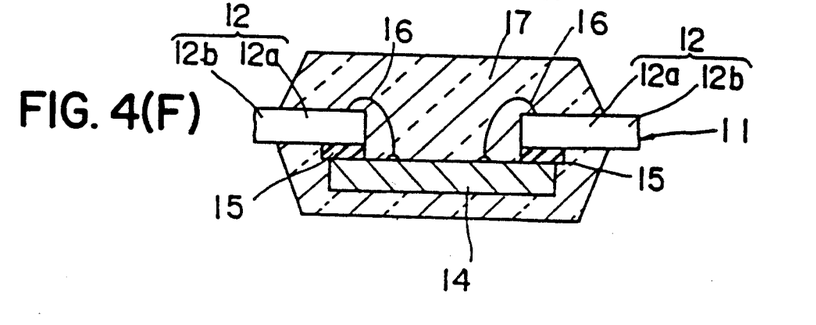

Then, at a resin molding step, the semiconductor chip 14 and the location around the semiconductor chip 14 are encapsulated by epoxy resin 17 (FIG. 4(F)).

Subsequently, solder plating is applied to outer leads 12b and, thereafter, the leads 12 are cut off from an outer frame of the lead frame 11 while the outer leads 12b are shaped.

By the steps, a semiconductor device as a product is obtained.

According to the process of producing a semiconductor device of this embodiment, the following effects can be attained.

In particular, with the process of producing a semiconductor device according to this embodiment, since the lead frame 11, wherein the inner leads 12a are connected to a connecting portion, is used and the end portions of the inner leads 12a are formed after the insulating tape 15 has been bonded, a change in distance between the inner leads 12a is prevented by the connecting portion 13 until after the insulating tape 15 is bonded, and after punching of the connecting portion 13, a change in distance between the inner leads 12a is prevented by the insulating tape 15. Due to this action, the distances between adjacent inner leads 12a are maintained appropriately so that recognition of the individual inner leads 12a upon wire bonding is facilitated and the time for wire bonding can be reduced significantly.

Further, with the process of producing a semiconductor device according to this embodiment, since the main face of the semiconductor chip 14 is partially overlapped on the lower faces of the end portions of the inner leads 12a, the length of the leads encapsulated in a package is increased with a semiconductor device thus produced. Due to this action, peeling off the leads 12 is prevented effectively. This is particularly effective where a semiconductor device 14 of a large size is to be encapsulated in a small package. Further, since the individual leads 12 function as heat radiating plates, reduction in resistance of the semiconductor device can be anticipated, and incidentally, improvements in the characteristics of the semiconductor device can be anticipated.

In addition, since the main face of the semiconductor chip 14 is partially overlapped on the lower faces of the end portions of the inner leads 12a, connection between the bonding pads 14a and the inner leads 12a is established on the upper side of the semiconductor chip 14. Accordingly, the resin package itself can be reduced in size.

Further, with the process of producing a semiconductor device according to the embodiment heretofore described, since the semiconductor chip 14 is fixed to the lower faces of the end portions of the inner leads 12a, the inner leads are further fixed after fixing of the semiconductor chip 14. Due to the action, contact between adjacent inner leads 12a and wires 16 upon molding of a resin can be prevented with certainty.

According to the production process of the present embodiment, by the involved effects, improvements in the throughput and the yield of a production line for semiconductor devices can be achieved and semiconductor devices of a high reliability can be provided.

A second embodiment of process of producing a semiconductor device according to the present invention is illustrated in FIGS. 4(A) to 4(F).

While a lead frame 21 which is used in the second embodiment has a basically similar construction to that of the lead frame 11 (FIG. 1) which is used in the first embodiment, it is different from the lead frame 11 used in the first embodiment in that it is shaped such that the thickness of adjacent portions of inner leads 22a and the connecting portion 23 may be smaller than the thickness of the other portions of the leads. In particular, the lead frame 21 has a recessed portion formed on a lower face thereof in a central zone of the frame.

In the present embodiment, an insulating tape 15 is bonded or stuck to the recessed portion formed on the lower face of the lead frame 21 shown in FIG. 4(A). In the other aspects, the present embodiment is substantially similar to the first embodiment.

In short, after bonding or sticking of the insulating tape 15, a connecting portion 13 of the lead frame 21 is punched as shown in FIG. 4(C) using a press machine to form end portions of the inner leads 22a by removal of connecting portion 3 and a semiconductor chip 14 is fixed via the remaining portion of tape 15 to lower faces of the end portions of the inner leads 22a (FIG. 4(D)), and then bonding pads 14a of the semiconductor chip 14 and the inner leads 22a are electrically connected to each other by means of wires 16 (FIG. 4(E)); whereafter, the semiconductor chip 14 and a location around the semiconductor chip 14 are encapsulated with epoxy resin 17 (FIG. 4(F)). Subsequently, solder plating is applied to outer leads 22b, and then the leads 22 are cut off from an outer frame 21 and the outer leads 22b are shaped.

By these steps, a semiconductor device is obtained.

Also, by the present embodiment, similar effects to those of the first embodiment can be obtained.

Further, with the process of producing a semiconductor device according to the present embodiment, since the lead frame 21 having the recessed portion on the lower face thereof as described above is used and the semiconductor chip 14 is fixed to the recessed portion, the semiconductor chip 14 is located at an upper position relative to the lead frame 21 comparing with the first embodiment so that the bonding pads 14a and the inner leads 22a can be connected to each other by means of the comparatively short wires 16. As a result, occurrence of wire short-circuiting at a resin molding step and so on is restrained.

It is to be noted that the lead frame 21 described above has also the following advantages.

In particular, the distances of ends of the inner leads 22a decrease as the number of pins increases. The tendency is outstanding particularly where it is intended to overlap the end portions of the inner leads 22a on the semiconductor chip 14. In this instance, however, if the lead frame 21 has a great thickness, the end portions of the inner leads 22a cannot be patterned with a high degree of accuracy. On the other hand, there is a limitation of reduction in thickness of the entire lead frame 21. This is because the rigidity of the outer leads 22b will be deteriorated so that the outer leads 22b will become readily bendable. To the contrary, with such a lead frame 21 as described above, it is possible to improve the patterning accuracy of the ends of the inner leads 22a without deteriorating the rigidity of the outer leads 22b.

A third embodiment of process of producing a semiconductor device according to the present invention is illustrated in FIGS. 5(A) to 5(F).

In the third embodiment, a lead frame 21 which is used in the second embodiment (hereinafter referred to as first lead frame) and another lead frame 31 shown in FIG. 6 (hereinafter referred to as second lead frame) are used.

Figure 6:
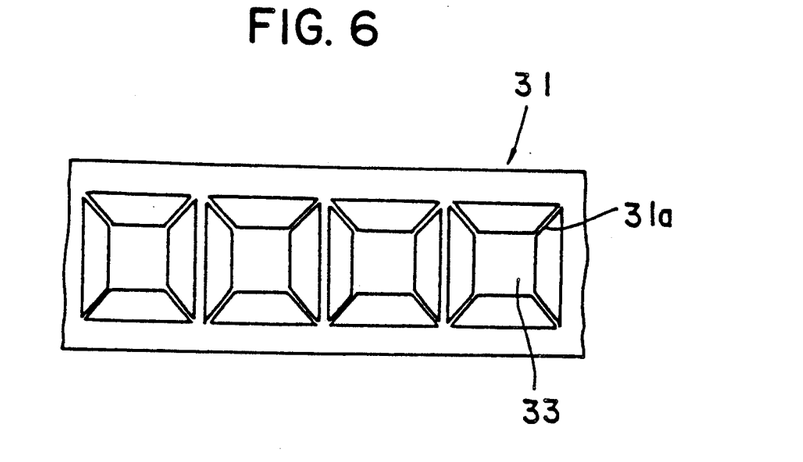
FIG. 6 is a plan view of a second lead frame which is used in the third embodiment of process of producing a semiconductor device according to the present invention.

Here, the second lead frame 31 has only a tab 33 formed thereon which is supported on an outer frame of the second lead frame 31 by means of hanging pins 31a as shown in FIG. 6. In particular, the lead frame 31 is a so-called "tab only frame".

The process of the present embodiment which is performed using the lead frames 21 and 31 is as follows:

A reverse face of a semiconductor chip 14 is fixed in advance to an upper face of the tab 33 of the second lead frame 31 by means of a bonding agent (not shown) such as silver paste, epoxy resin or the like.

Figure 5A:
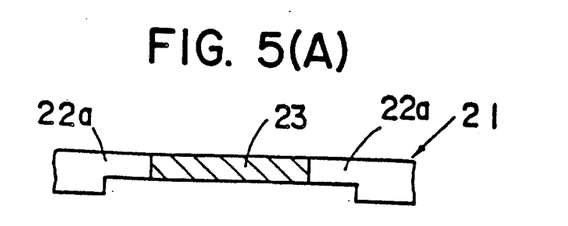
FIGS. 5(A) to 5(F) are flow diagrams of a third embodiment of process of producing a semiconductor device according to the present embodiment.
Figure 5B:
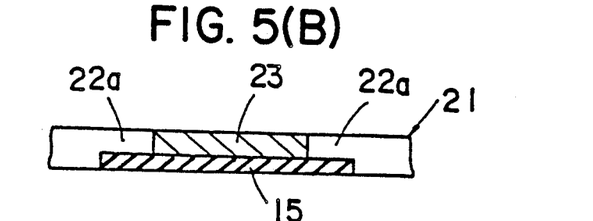
Figure 5C:
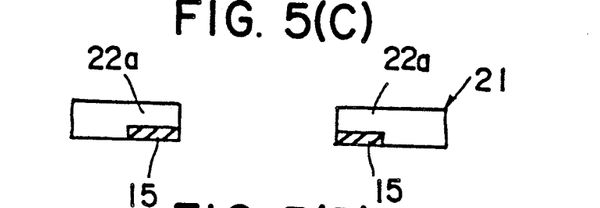
Figure 5D:
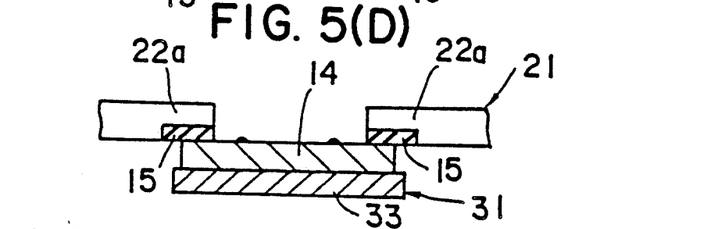
Figure 5E:
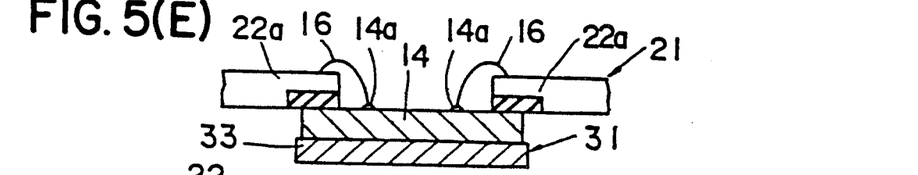

An insulating tape 15 having a size equal to or a little greater than the size of the semiconductor chip 14 (FIG. 5(D)) is bonded to the lower face of the recessed portion of the first lead frame 21 shown in FIG. 5(A) (FIG. 5(B)).

After the insulating tape 15 has been stuck in this manner, the connection portion 23 of the first lead frame 21 is punched as shown in FIG. 5(C) using a press machine to form end portions of the inner leads 22a.

Subsequently, the first lead frame 21 is placed on the semiconductor chip 14 (FIG. 5(D)). Here, the semiconductor chip 14 may be fixed to a lower face of an end portion of the first lead frame 21 as in the first and second embodiments. Subsequently, bonding pads 14a of the semiconductor chip 14 and the inner leads 22a are electrically connected to each other by means of wires 16 of Au, Al, Cu or the like (FIG. 5(E)).

Figure 5F:
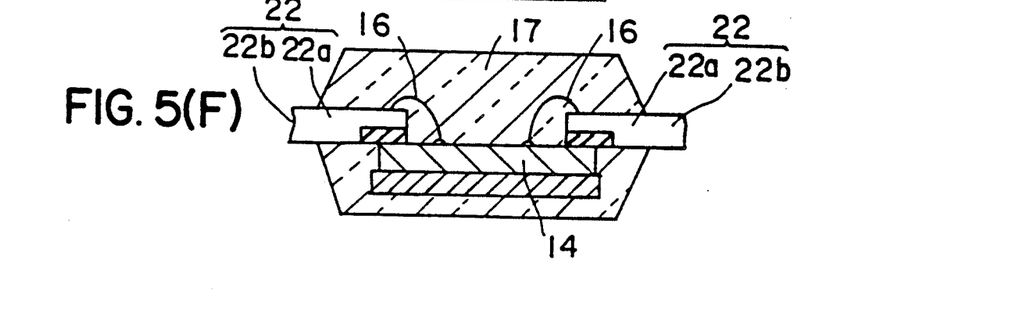

Then, at a resin molding step, the semiconductor chip 14 and the location around the semiconductor chip 14 are encapsulated by epoxy resin 17 (FIG. 5(F)).

Subsequently, solder plating is applied to the outer leads 12b, and thereafter the leads 22 are cut off from an outer frame of the first lead frame 21 while the outer leads 22b are shaped. At this stage, the hanging pins 31a of the second lead frame 31 are cut. It is to be noted that, where the semiconductor chip 14 is fixed to the inner leads 21a, the hanging pins 31a of the second lead frame 31 may be cut prior to the resin molding.

By the steps, a semiconductor device is obtained.

Also, with the third embodiment, similar effects to those of the second embodiment can be obtained.

Further, with the process of producing a semiconductor device of the third embodiment, since two lead frames are used, the heat radiating property of a semiconductor device produced is further increased so that the resistance is decreased. By the action, the characteristics of the semiconductor device are further improved.

Effects which can be attained by representative embodiments of the present invention disclosed in the present patent application will be described briefly in the following.

In particular, after an insulating tape is bonded to lower faces of portions of inner leads of a lead frame wherein these end portions of the inner leads are connected to a connecting portion, end portions of the inner leads are formed by removal of the connecting portion of the lead frame, and then a main face of a semiconductor chip is partially overlapped on the lower faces of the end portions of the inner leads thus formed, whereafter bonding pads of the semiconductor chip and the inner leads are connected to each other at the overlapping location by means of wires. Accordingly, the distances between the inner leads are maintained appropriately during the production process so that the time for recognition of the inner leads upon wire bonding is reduced significantly and short-circuiting of adjacent wires and inner leads is prevented. As a result, the object described above of providing improvements in the throughput and in the yield of a production line are attained.

Further, since the semiconductor chip is overlapped on the end portions of the inner leads and the bonding pads of the semiconductor chip and the inner leads are connected to each other at the overlapping location by means of the wires, reduction in size of a resin package can be anticipated.

Figure 9A:
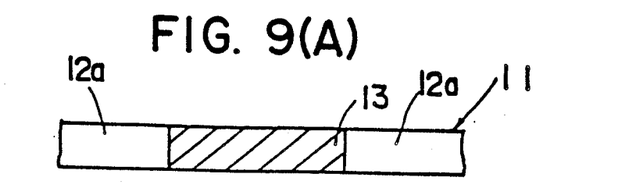
FIGS. 9(A) to 9(E) are flow diagrams of a fourth embodiment of the process of producing a semiconductor device according to the present invention.
Figure 9B:
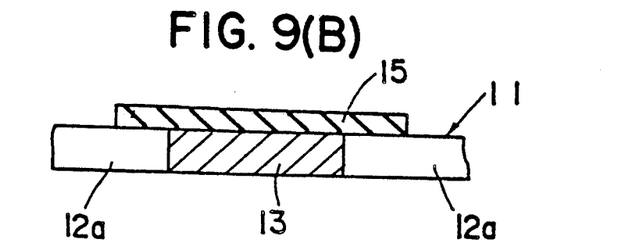
Figure 9C:
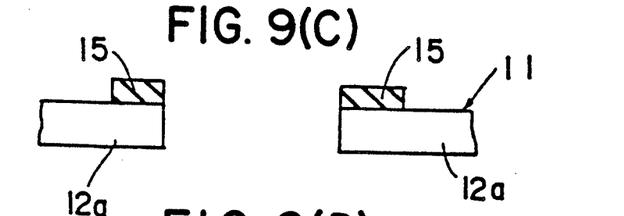
Figure 9D:
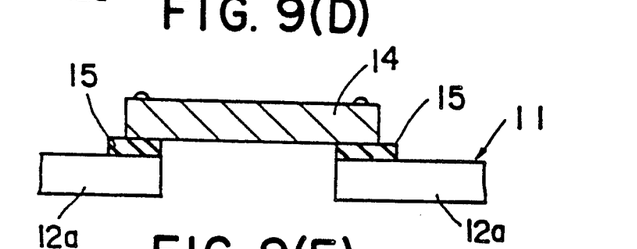

In the fourth embodiment, an insulating tape 15 having a size equal to or a little greater than the size of a semiconductor chip 14 (FIG. 9(D)) to be mounted is stuck to upper faces of a connecting portion 13 of a lead frame 11 shown in FIG. 9(A) (the lead frame shown in FIG. 1) and a location around the connecting portion 13 (portions of the inner leads 12a) (FIG. 9(B)). As the insulating tape 15, a tape is used which is made of a resin of a polyimide, not particularly limited to this resin, and has a bonding agent, applied to a lower face thereof, and bonding of the tape of the resin of the polyimide is made, for example, by pressurization for 0.3 seconds under 10 to 20 kg/cm$^2$ in an atmosphere of 160° to 200° C.

After the insulating tape 15 has been bonded in this manner, the connecting portion 13 of the lead frame 11 is punched as shown in FIG. 9(C) using a press machine to form end portions of the inner leads 12a. Thereupon, part of the insulating tape 15 bonded to the upper face of the connecting portion 13 is also punched at the same time, but the other part of the insulating tape 15 other than the punched portion remains, and the distances between the inner leads 12a are maintained appropriately by the remaining insulating tape 15.

Subsequently, at a die bonding step, a bonding agent (not shown) such as silver paste, epoxy resin or the like is placed on the upper face of the remaining insulating tape 15, and a semiconductor chip 14 is joined by means of the bonding agent as shown in FIG. 9(D).

Figure 9E:
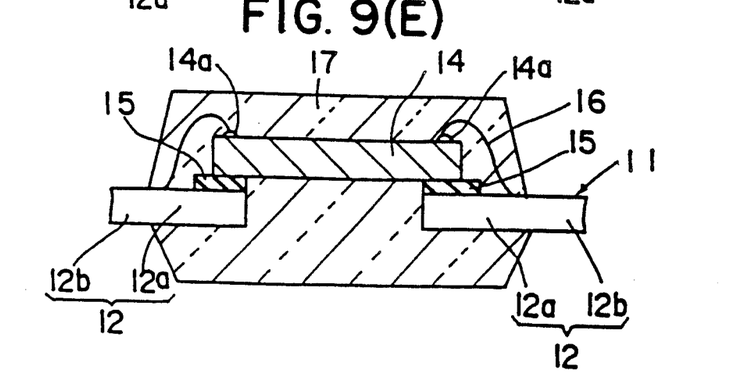

Thereafter, at a wire bonding step, bonding pads 14a of the semiconductor chip 14 and the inner leads 12a are electrically connected to each other by means of wires 16 of Au, Al, Cu or the like, and the semiconductor chip 14 and the location around the semiconductor chip 14 are encapsulated by epoxy resin 17 (FIG. 9(E)). Subsequently, solder plating is applied to outer leads 12b, and thereafter the leads 12 are cut off from an outer frame of the lead frame 11 while the outer leads 12b are shaped.

By these steps, a semiconductor device, as a finished product is obtained.

According to the process of producing a semiconductor device of the fourth embodiment, heretofore described, the following effects can be attained.

In particular, with the process of producing a semiconductor device according to this embodiment, since the lead frame 11 wherein the inner leads 12a are connected to a connecting portion 13 is used and end portions of the inner leads 12a are formed by removal of the connecting portion 13 after the insulating tape 15 has been bonded, a change in distance between the inner leads 12a is prevented by the connecting portion 13 until after the insulating tape 15 is bonded, and after punching of the connecting portion 13, a change in distance between the inner leads 12a is prevented by the insulating tape 15. Due to this action, the distances between adjacent inner leads 12a are maintained appropriately so that recognition of the individual inner leads 12a upon wire bonding is facilitated and the time for wire bonding can be reduced significantly.

Further, with the process of producing a semiconductor device according to this fourth embodiment, since the semiconductor chip 14 is joined to the upper faces of the end portions of the inner leads 12a via the remaining portion of the tape 15, various locations of the inner leads 12a can be utilized as connecting locations to the wires 16. Due to this action, semiconductor chips 14 of various sizes which has the same number of pins (number of leads) can be mounted. Accordingly, it becomes unnecessary to individually prepare lead frames in accordance with sizes of semiconductor chips 14 to be mounted, and standardization of lead frames and reduction in the cost of semiconductor devices can be anticipated.

Further, with the process of producing a semiconductor device according to the embodiment described above, since the semiconductor chip 14 is joined to the upper faces of the end portions of the inner leads 12a, the length of the leads to be encapsulated in a package is increased. Due to the action, letting off of the leads 12 can be prevented effectively.

Moreover, with this process of producing a semiconductor device, since the semiconductor chip 14 is joined to the upper faces of the end portions of the inner leads 12a, via the tape 15, the inner leads 12a are fixed after joining of the semiconductor chip 14. Due to the action, contact between adjacent inner leads 12a and wires 16 upon molding of a resin can be further prevented.

According to the production process of the present embodiment, by the involved effects, improvements in the throughput and in the yield of a production line for semiconductor devices can be anticipated and the reliability of the semiconductor devices can be improved.

The fifth embodiment of process of producing a semiconductor device according to the present invention is illustrated in FIGS. 10(A) to 10(E).

Also, in the case of the process of producing a semiconductor device of the second embodiment, a lead frame 11 (FIG. 1) similar to that of the first embodiment is used.

Figure 10A:
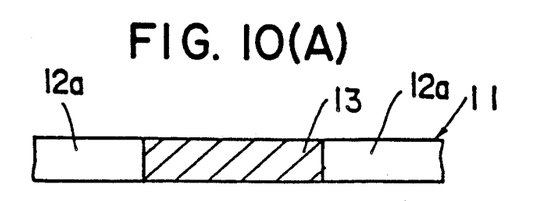
FIGS. 10(A) to 10(E) are flow diagrams of a fifth embodiment of process of producing a semiconductor device according to the present invention.
Figure 10B:
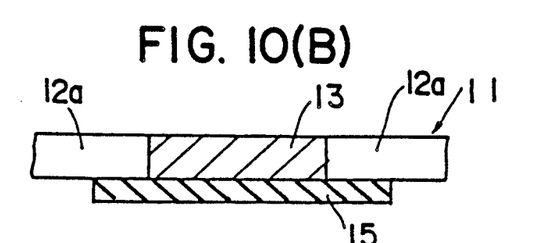

In the present embodiment, when an insulating tape 15 is to be bonded to a connecting portion 13 and a location around the connecting portion 13 of a lead frame 11 shown in FIG. 10(A) (lead frame similar to that shown in FIG. 1), the insulating tape 15 is bonded to lower faces of the connecting portion 13 and the location around the connecting portion 13 (FIGS. 10(B)). In this regard, the present embodiment is different from the fifth embodiment. In the other respects, the present embodiment is substantially similar to the fourth embodiment.

Figure 10C:
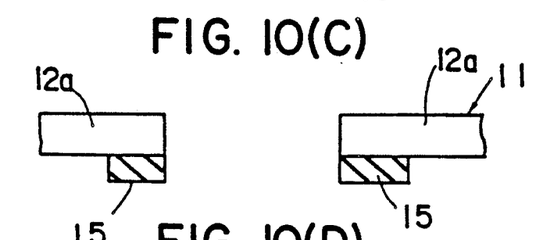
Figure 10D:
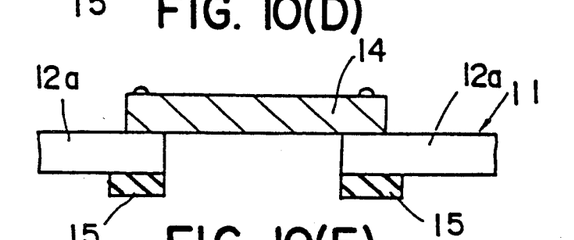
Figure 10E:
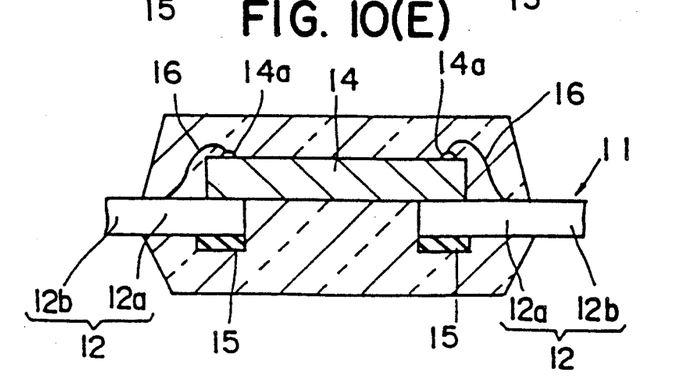

In short, after the insulating tape 15 has been adhesively bonded to the lead frame, the connecting portion 13 of the lead frame 11 is punched as shown in FIG. 10(C) using a press machine to form end portions of the inner leads 12a. Then, at a die bonding step, a semiconductor chip 14 is joined to upper faces of the end portions of the inner leads 12a by means of an insulative bonding agent (FIG. 10(D)). Meanwhile, at a wire bonding step, bonding pads 14a and the inner leads 12a are electrically connected to each other by means of wires 16, and then the semiconductor chip 14 and a location around the semiconductor chip 14 are encapsulated with epoxy resin 17 (FIG. 10(E)). After then, solder plating is applied to outer leads 12b and the leads 12 are cut off from an outer frame of the lead frame 11 while the outer leads 12b are shaped.

By the steps, a semiconductor device as a product is obtained.

Also, with the fifth embodiment, similar effects to those of the fourth embodiment can be attained.

A sixth embodiment of process of producing a semiconductor device according to the present invention is illustrated in FIGS. 11(A) to 11(E).

While a lead frame 21 is used in the sixth embodiment has a basically similar construction to that of the lead frame 11 (FIG. 1) which is used in the first and second embodiments, it is different from the lead frame 11 of FIG. 1 in that it is shaped such that the thickness of adjacent portions of inner leads 22a and a connecting portion 23 may be smaller than the thickness of the other portions of the leads. In particular, the lead frame 21 has a recessed portion formed on an upper face thereof.

Figure 11A:
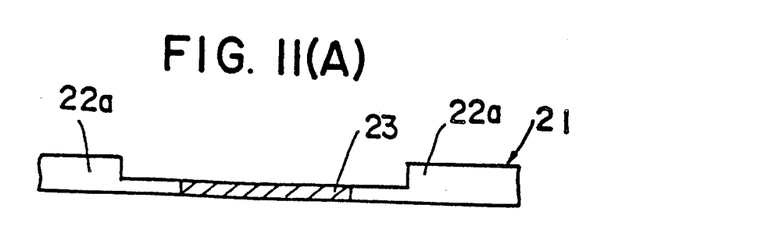
FIGS. 11(A) to 11(E) are flow diagrams of a sixth embodiment of process of producing a semiconductor device according to the present invention.
Figure 11B:
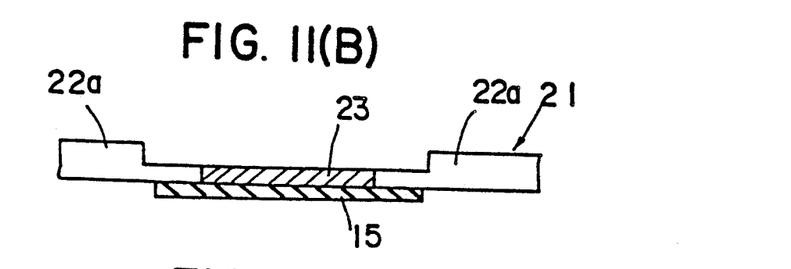

In the present embodiment, an insulating tape 15 is adhered to lower faces of the connecting portion 23 and a location around the connecting portion 23 of the lead frame 21 as shown in FIG. 11(A), that is, the portions of a smaller thickness (FIG. 10(B)). In the other regards, the present embodiment is substantially similar to the fifth embodiment.

Figure 11C:
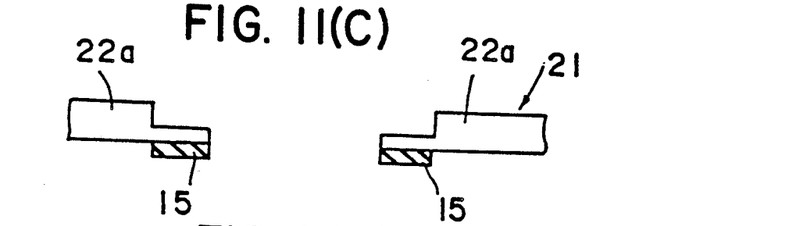
Figure 11D:
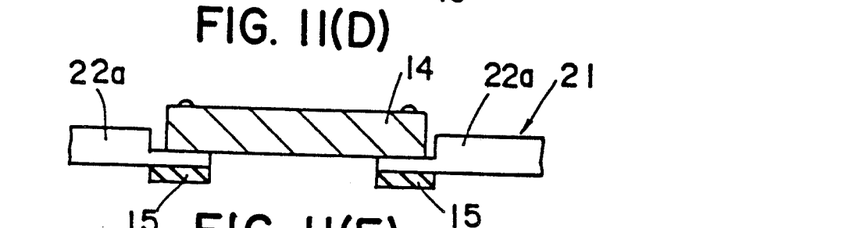
Figure 11E:
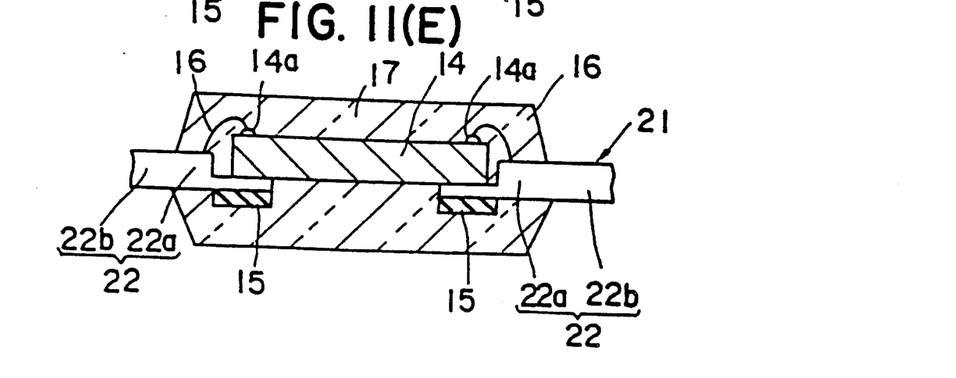

In short, after sticking of the insulating tape 15, a connecting portion 23 of the lead frame 21 is punched as shown in FIG. 11(C) using a press machine to form end portions of the inner leads 22a and a semiconductor chip 14 is joined to upper faces of the end portions of the inner leads 22a with an insulative bonding agent (FIG. 11(D)), and then bonding pads 14a of the semiconductor chip 14 and the inner leads 22a are electrically connected to each other by means of wires 16, whereafter the semiconductor chip 14 and a location around the semiconductor chip 14 are encapsulated with epoxy resin 17 (FIG. 11(E)). Subsequently, solder plating is applied to outer leads 22b and the leads 22 are cut off from an outer frame of the lead frame 21 while the outer leads 22b are shaped.

By these steps, a semiconductor device as a product is obtained.

It is to be noted that the insulating tape 15 may be bonded to upper faces of the connecting portion 23 and the location around the connecting portion 23, that is, the portions having a smaller thickness.

Also, by the present embodiment, similar effects to those of the fifth embodiment can be obtained.

Further, with the process of producing a semiconductor device according to this embodiment, since the lead frame 21 having such a recessed portion as described above is used and the semiconductor chip 14 is joined at the recessed portion, the semiconductor chip 14 is located at a lower position relative to an upper face of the lead frame 21 and the bonding pads 14a and the inner leads 22a are connected to each other by means of the comparatively short wires 16. As a result, occurrence of wire short-circuiting during the resin molding step is restrained.

In particular, the distances of ends of the inner leads 22a decrease as the number of pins increases. The tendency is outstanding particularly where the end portions of the inner leads 22a are overlapped on the semiconductor chip 14. In this instance, however, if the lead frame 21 has a great thickness, the end portions of the inner leads 22a cannot be patterned with a high degree of accuracy. On the other hand, there is a limitation of reduction in thickness of the entire lead frame 21. This is because the rigidity of the outer leads 22b will be deteriorated so that the outer leads 22b will become readily bendable. To the contrary, with such a lead frame 21 as described above, it is possible to improve the patterning accuracy of the ends of the inner leads 22a without deteriorating the rigidity of the outer leads 22b.

An seventh embodiment of semiconductor device according to the present embodiment is illustrated in FIGS. 12(A) to 12(E).

Figure 12A:
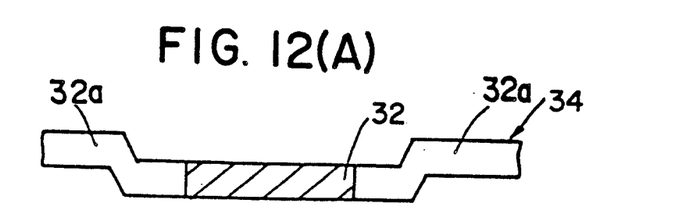
FIGS. 12(A) to 12(E) are flow diagrams of a seventh embodiment of process of producing a semiconductor device according to the present embodiment.
Figure 12B:
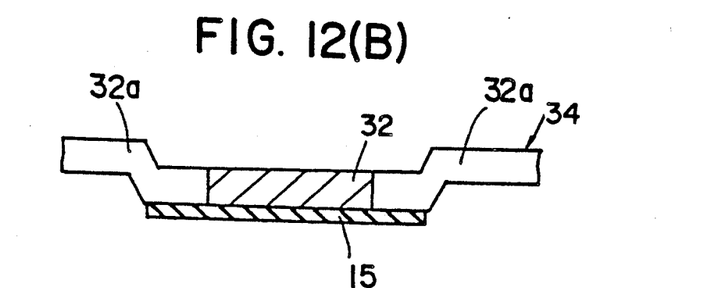

In a lead frame 34, (FIG. 12(A)), which is used in the seventh embodiment, portions of inner leads 32a are formed by bending downwardly with respect to the other portions of leads. And in the present embodiment, an insulating tape 15 is bonded to lower faces of a connecting portion 32 and the bent portions of the inner leads 32a of the lead frame 34 (FIG. 5(B)). In the other regards, the seventh embodiment is similar to the fifth embodiment.

Figure 12C:
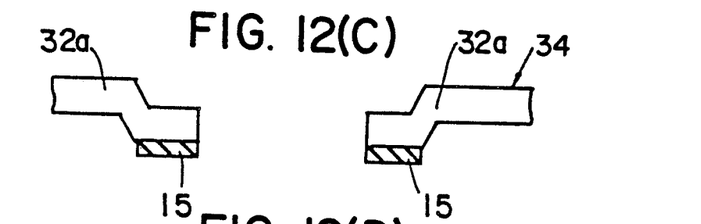
Figure 12D:
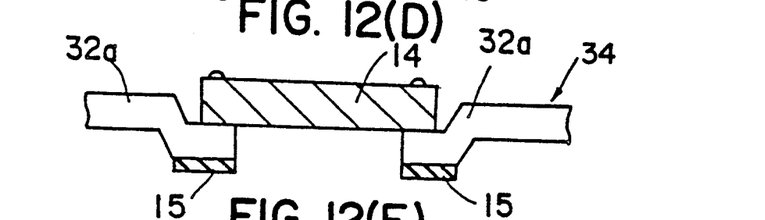
Figure 12E:
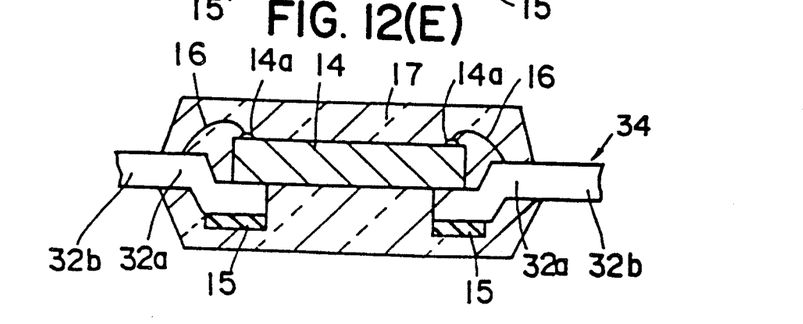

In short, after adhesively bonding the insulating tape 15, the connecting portion 32 of the lead frame 31 is punched as shown in FIG. 12(C) using a press machine to form end portions of the inner leads 32a and a semiconductor chip 14 is joined to upper faces of the end portions of the inner leads 32a (FIG. 12(D)), and then bonding pads 14a of the semiconductor chip 14 and the inner leads 32a are electrically connected to each other by means of wires 16, whereafter the semiconductor chip 14 and a location around the semiconductor chip 14 are encapsulated with epoxy resin 17 (FIG. 12(E)). Subsequently, solder plating is applied to outer leads 32b and the leads 32 are cut off from an outer frame of the lead frame 34 while the outer leads 32b are shaped.

By these steps, a semiconductor device as a product is obtained.

Also, with the seventh embodiment, similar effects to those of the fifth embodiment can be obtained.

Further, according to the process of producing a semiconductor device of the present embodiment, since the lead frame 34 having such a recessed portion as described above is used and the semiconductor chip 14 is joined at the recessed portion, the semiconductor chip 14 is located at a lower position relative to an upper face of the lead frame 34 and the bonding pads 14a and the inner leads 32a are connected to each other by means of the comparatively short wires 16. As a result, occurrence of wire short-circuiting during a resin molding step is avoided.

Further, since the semiconductor chip 14 is located at a lower position relative to the upper face of the lead frame 34 as described above, the thickness of the package itself can be reduced.

What is claimed is:

1. A process of producing a semiconductor device comprising the steps of:
   providing a lead frame having inner leads spaced from each other and connected together by a connecting portion; bonding a layer of an insulating material to said connecting portion and to surrounding portions of the inner leads;
   removing said connecting portion and a portion of the layer of insulating material simultaneously to form end portions of the inner leads which are separated from each other and retained in a spaced arrangement by a remaining portion of said layer of insulating material;
   joining a semiconductor chip having bonding pads to the end portions of said inner leads;
   connecting the bonding pads on said semiconductor chip and said inner leads by means of wires; and
   encapsulating said semiconductor chip, the remaining portion of the layer of insulating material, said inner leads and said wires within a resin material;
   wherein a peripheral portion of one face of said semiconductor chip partially overlaps faces of said end portions.

2. A process of producing a semiconductor device according to claim 1 wherein:
   the thickness of the end portions of said inner leads and of said connecting portion is smaller than the thickness of the other portions of said lead frame.

3. A process of producing a semiconductor device according to claim 1, wherein the semiconductor chip is mounted on said end portions of the inner leads via the remaining portion of the layer of insulative material and a bonding agent.

4. A process of producing a semiconductor device comprising the steps of:
   forming a lead frame which has inner leads connected to a connecting portion;
   bonding an insulating material to an upper face of said connecting portion and to upper faces of portions of the inner leads closely adjacent to the connecting portion;
   removing said connecting portion and the insulating material bonded to its upper face to form end portions of said inner leads which are retained spaced from each other by a portion of the insulating material bonded to the upper faces of said closely adjacent portions of the inner leads;
   fixing a semiconductor chip to said end portions;
   connecting bonding pads formed on a main face of said semiconductor chip and said inner leads by means of wires; and
   encapsulating said semiconductor chip, the portion of insulating material bonded to said inner leads and said wires;
   wherein an opposite face of said main face is partially overlapped on the upper faces of said closely adjacent portions through said insulating material.

5. A process of producing a semiconductor device comprising the steps of:
   forming a lead frame with inner leads that are connected to a connecting portion of the lead frame;
   bonding a polymeric insulating material to lower faces of said connecting portion and of adjacent portions of said inner leads;
   removing said connecting portion to form end portions of said inner leads that are spaced from each other;
   mounting a semiconductor chip onto said end portions;
   connecting bonding pads formed on a main face of said semiconductor chip and said inner leads by means of wires; and
   encapsulating said semiconductor chip, the polymeric insulating material, said inner leads, and said wires in a resin;
   wherein an opposite face of said main face is partially overlapped on the upper faces of said end portions.

6. A process of producing a semiconductor device according to claim 5 wherein:
   the thickness of end portions of said inner leads and said connecting portion is smaller than the thickness of the other portions of said lead frame.

7. A process of producing a semiconductor device according to claim 5 wherein:
   end portions of said inner leads are bent downwardly with respect to other portions of said lead frame.

8. A process of producing a semiconductor device, wherein a semiconductor chip is to be joined to a lead frame and bonding pads of said semiconductor chip and inner leads of said lead frame are to be electrically connected to each other and, thereafter, said semiconductor chip and a location around said semiconductor chip are to be encapsulated in an encapsulating resin, the improvement wherein a lead frame is provided which has inner leads spaced from each other and integrally connected to a connecting portion of the lead frame located on a central part of the lead frame, an insulating polymeric tape is bonded to lower faces of portions of said inner leads of said lead frame to be formed into end portions and to said connecting portion, end portions of said inner leads are formed by removing said connecting portion while spacing between said inner leads is maintained by a portion of said insulating tape, and then a main face of a semiconductor chip is partially overlapped on the lower faces of the end portions of said inner leads, and bonded to the end portions via said portion of said insulating tape, whereafter bonding pads of said semiconductor chip and said inner leads are connected to each other at the overlapping locations by means of wires.

9. A process of producing a semiconductor device according to claim 8, wherein said semiconductor chip is bonded to said inner leads at overlapping locations between said inner leads and said semiconductor chip with a bonding agent.

10. A process of producing a semiconductor device according to claim 8, wherein another lead frame on which only a tab is formed is provided and after the reverse face of said semiconductor chip is joined to said tab, the end portions of said inner leads are overlapped on part of the main face of said semiconductor chip.

11. A process of producing a semiconductor device, wherein a semiconductor chip is to be joined to a lead frame and bonding pads of said semiconductor chip and inner leads of said lead frame are to be electrically connected to each other, the improvement wherein a lead frame is provided which has a connecting portion connected to a plurality of spaced inner leads at portions thereof which are to be formed into end portions of said inner leads, an insulating polymeric tape is bonded to said connecting portion and to said portions of said inner leads of said lead frame, end portions of said inner leads are formed by removing the connecting portion of said lead frame while spacing between said inner leads is maintained by a portion of said insulating polymeric tape, then a semiconductor chip is joined to upper faces of the end portions of said inner leads, whereafter bonding pads of said semiconductor chip and said inner leads are connected to each other by means of wires.

12. A process of producing a semiconductor device according to claim 11, wherein when said insulating tape is to be bonded to said portions of said inner leads, said insulating tape is bonded to upper faces of said portions of said inner leads.

13. A process of producing a semiconductor device according to claim 11, wherein when said insulating tape is to be bonded to said portions of said inner leads, said insulating tape is bonded to lower faces of said portions of said inner leads.

14. A process of producing a semiconductor device according to claim 11, wherein said lead frame is shaped in such manner that the thickness of the end portions of said inner leads is smaller than the thickness of the other portions of said inner leads.

15. A process of producing a semiconductor device according to claim 11, wherein said insulating polymeric tape is made from a polymeric resin.

* * * * *